(12) United States Patent
Murphy

(10) Patent No.: US 6,653,222 B2
(45) Date of Patent: *Nov. 25, 2003

(54) PLASMA ENHANCED LINER

(75) Inventor: William J. Murphy, Essex Junction, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 82 days.

(21) Appl. No.: 09/365,908

(22) Filed: Aug. 3, 1999

(65) Prior Publication Data

US 2002/0164863 A1 Nov. 7, 2002

(51) Int. Cl.⁷ .................... H01L 21/4763; H01L 21/31; H01L 21/469
(52) U.S. Cl. ............... 438/622; 438/627; 438/643; 438/648; 438/775
(58) Field of Search ................... 438/622, 627, 438/643, 648, 775

(56) References Cited

U.S. PATENT DOCUMENTS

| | | | | |
|---|---|---|---|---|
| 4,783,248 A | * | 11/1988 | Kohlhase et al. | 204/192.17 |
| 4,868,632 A | * | 9/1989 | Hayashi et al. | 357/534 |
| 5,185,211 A | * | 2/1993 | Sue et al. | 428/472 |
| 5,241,193 A | * | 8/1993 | Pfiester et al. | 257/67 |
| 5,291,053 A | * | 3/1994 | Pfiester et al. | 257/393 |
| 5,334,861 A | * | 8/1994 | Pfiester et al. | 257/67 |
| 5,374,566 A | * | 12/1994 | Iranmanesh | 438/202 |
| 5,462,895 A | * | 10/1995 | Chen | 437/200 |
| 5,552,344 A | * | 9/1996 | Jang et al. | 437/195 |
| 5,760,475 A | | 6/1998 | Cronin et al. | |
| 5,807,788 A | * | 9/1998 | Brodsky et al. | 438/653 |
| 6,091,148 A | * | 7/2000 | Givens et al. | 257/750 |
| 6,150,257 A | * | 11/2000 | Yin et al. | 438/622 |
| 6,221,792 B1 | * | 4/2001 | Yang et al. | 438/776 |

* cited by examiner

Primary Examiner—Wael Fahmy, Jr.
Assistant Examiner—Shrinivas H. Rao
(74) Attorney, Agent, or Firm—McGinn & Gibb, PLLC; Mark F. Chadurjian, Esq.

(57) ABSTRACT

A method and structure for forming a refractory metal liner, includes depositing a layer of refractory metal on a first conductive layer, at least half of the depositing being carried out in the presence of an amount of passivating agent that is sufficient to impede subsequent reaction of at least a top half of the layer of refractory metal with the first conductive layer and is less than an amount of passivating agent necessary to form a stoichiometric refractory metal with the passivating agent, and annealing the refractory metal and the first conductive layer in a first element ambient, thereby forming a stoichiometric refractory metal with the first element in at least a portion of the top half of the layer of refractory metal.

15 Claims, 2 Drawing Sheets

PLASMA ENHANCED LINER

BACKGROUND OF THE INVENTION

1. Field of the Invention

The present invention generally relates to liners for electrical contacts within integrated circuit chip devices and more particularly to a nitride enhanced titanium liner for a refractory metal contact formed using a chemical vapor deposition process.

2. Description of the Related Art

As the device densities of integrated circuits increase, there is a need to utilize metallurgies that can be conformally coated over the resulting steep topologies. It has been found that the family of metals commonly referred to as the "refractory metals," (i.e., tungsten, titanium, molybdenum, nickel, etc.) can be conformally coated on substrates using low pressure chemical vapor deposition techniques (LPCVD). In these techniques, a refractory metal source gas (e.g., tungsten hexafluoride) undergoes a series of reduction reactions so as to deposit a layer of tungsten on the substrate.

One of the problems with utilizing a refractory metal such as tungsten is that it has a poor degree of adhesion to the underlying insulator (e.g., silicon oxide). One method of increasing the adhesion between the refractory metal and the underlying layers is to incorporate an intermediate material having a high degree of adhesion to both the refractory metal and the underlying materials. As disclosed in U.S. Pat. No. 5,769,475 to Cronin et al. (hereinafter "Cronin"), incorporated fully herein by reference, an intermediate layer of titanium nitride, hafnium, zirconium, niobium, vanadium, chromium or nickel will provide a high degree of adhesion between tungsten and underlying layers.

In most applications, conductive structures such as gate electrodes and interconnecting stacks should have sidewalls that are as nearly vertical as possible. To the extent that these sidewalls are not vertical, extra chip surface area is unnecessarily consumed and the electrical properties of the conductive structure are degraded. Accordingly, the intermediate layer incorporated between the refractory metal and the underlying layers should have an etch rate that approximates the etch rate of refractory metal in an anisotropic (i.e., directional) etch, such as a halogen-based reactive ion etch (RIE). It has been discovered that titanium nitride has an etch rate that is substantially equal to tungsten in a halogen-based RIE, which permits an isotropic profile to be easily achieved.

As mentioned above, to form a conformal coating of tungsten or molybdenum, chemical vapor deposition (CVD) techniques are preferred to sputtering or evaporation techniques. In CVD of tungsten, tungsten reduction is induced from a tungsten hexafluoride ($WF_6$) source gas. As a consequence, tungsten crystals form and grow on the underlying layers. The ability of these crystals to form and grow (i.e., nucleate) on the underlying layers is essential to providing a uniform film. Cronin discloses that titanium nitride present good nucleation sites for CVD tungsten or molybdenum.

Cronin also discloses that titanium nitride provides good barrier properties when incorporated in a tungsten-titanium nitride stack. In the case where tungsten is used as an interconnect structure or as a wiring plane, titanium nitride provides sufficient resistance against electromigration. Moreover, titanium nitride prevents diffusion of species (e.g., silicon) from the underlying layers into the tungsten at processing temperatures of up to 1000° C. Also, titanium nitride serves as a good barrier against fluorine penetration during CVD of tungsten. In addition, a tungsten-titanium nitride conductive stack provides an extremely low contact resistance.

SUMMARY OF THE INVENTION

It is, therefore, an object of the present invention to provide a process of forming a refractory metal liner that includes depositing a layer of refractory metal on a first conductive layer, where at least half of the depositing is carried out in the presence of an amount of passivating agent that is sufficient to impede subsequent reaction of at least a top half of the layer of refractory metal with the first conductive layer and is less than an amount of passivating agent necessary to form a stoichiometric refractory metal with the passivating agent. The process also includes annealing the refractory metal and the first conductive layer in a first element ambient, thereby forming a stoichiometric refractory metal with the first element in at least a portion of the top half of the layer of refractory metal.

The depositing step forms a barrier in a central portion of the layer of refractory metal. The barrier impedes impurities from diffusing through the layer of refractory metal during the annealing process. The impurities include silicon impurities. The process also includes forming a second conductive layer over the layer of refractory metal in a chemical vapor deposition process, wherein the barrier impedes impurities from diffusing through the layer of refractory metal during the chemical vapor deposition process. These impurities include fluorine impurities.

The refractory metal can be either tungsten, titanum, molybdenum or nickel. The passivating agent can be nitrogen and/or chlorine, and the first element can be hydrogen, nitrogen, and/or ammonia.

Another embodiment of the invention forms an electrical connection in an integrated circuit chip and includes depositing a liner on a first conductive layer. A portion of the depositing is carried out in the presence of a passivating material, wherein the passivating material combines with the liner to form a barrier. The barrier impedes impurities from diffusing from the first conductive layer through the liner. The process also includes annealing the liner and the first conductive layer in a first element ambient, forming a second conductive layer over the liner. The barrier impedes the impurities from diffusing from said second conductive layer through the liner during the forming of the second conductive layer.

Another embodiment of the invention is a refractory metal liner that has a barrier that includes a passivating agent. The barrier impedes a subsequent reaction of at least a top half of the refractory metal liner with an adjacent conductive layer, an amount of the passivating agent in the barrier being less than an amount necessary to form a stoichiometric combination of the refractory metal liner and the passivating agent.

The barrier impedes impurities from diffusing from the first conductive layer through the refractory metal. These impurities includes silicon impurities. There is also a second conductive layer positioned over the refractory metal. The barrier impedes impurities from diffusing from the second conductive layer through the refractory metal. These impurities include fluorine impurities. The refractory metal can be either tungsten, titanium, molybdenum or nickel and the passivating agent can be nitrogen and/or chlorine.

Another embodiment is an electrical connection in an integrated circuit chip. The electrical connection includes a first conductive layer and a liner on the first conductive layer. The liner includes a barrier that impedes impurities from diffusing from the first conductive layer through the line. The invention also includes a second conductive layer over the liner. The barrier impedes the impurities from diffusing from the second conductive layer through the liner.

The sub-stoichiometric barrier of the passivating agent helps keep the liner from bonding with impurities during the annealing process by bonding the central portion of liner with the passivating agent instead of with the impurities. By including the passivating agent in the central portion of the liner, there is less free liner material available to bond with the impurities during the annealing process. Thus, any such impurities which bond with the liner will be principally limited to the upper portion of the liner. For example, titanium is highly reactive and will absorb oxygen (e.g., an impurity) very quickly when annealed. The fixed passivating agent barrier limits the oxidation of the upper portion of the liner.

The fixed passivating agent barrier similarly limits the amount of liner material that is available to bond with impurities (e.g., silicon) diffusing from lower layers. Thus, the barrier layer prevents, for example, silicon agglomeration during the annealing process. By reducing the amount of silicon in the liner, the formation of fluorine compounds is reduced during the subsequent fluorine based chemical vapor deposition.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
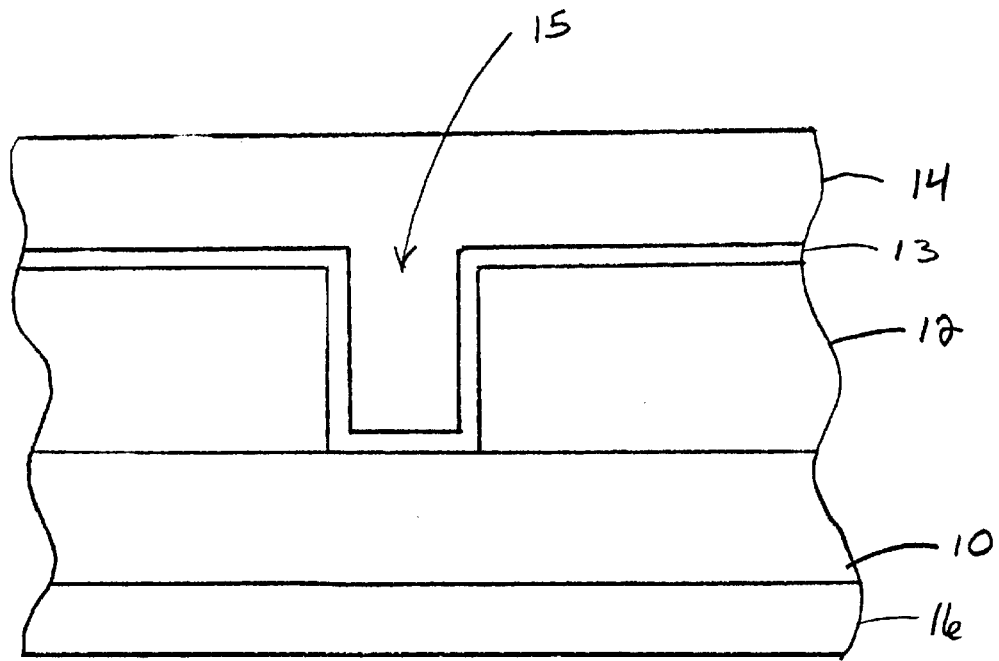
FIG. 1 is a schematic diagram of an integrated circuit structure according to the invention.

As discussed above, one method of increasing the adhesion between a refractory metal and underlying layers is to incorporate an intermediate material having a high degree of adhesion to both the refractory metal and the underlying materials. For example, in Cronin, supra, a titanium nitride liner is used with the tungsten contact to increase adhesion. However, the present inventor found that a titanium liner formed according to conventional processes, such as those disclosed in Cronin, may include excessive amounts of oxygen and silicon. The silicon reacts with the fluorine during the subsequent tungsten chemical vapor deposition. Such fluorine and oxygen compounds are very resistive and decrease the adhesive properties of the titanium liner.

More specifically, conventional processes such as that disclosed in Cronin deposit a titanium liner over a silicided silicon substrate and anneal the structure in the presence of nitrogen gas. This conventional anneal forms titanium silicide moving upward through the titanium liner, and titanium nitride moving downward through the titanium liner. Further, the titanium oxidizes with any free oxygen which is within the anneal furnace.

The titanium silicide formation is faster than the titanium nitride formation which sometimes allows substantial amounts of silicon to penetrate through the titanium. During the subsequent tungsten chemical vapor deposition, fluorine may form both titanium fluorides and silicon fluorides in the titanium liner. Such fluorine compounds may degrade the conductive and adhesive properties of underlying layers. The fluorine content is especially high at the titanium liner/tungsten interface and a significant amount of this fluorine penetrates into the layers beneath the titanium underlayer.

The invention overcomes these problems by doping the liner with a passivating agent to form a barrier prior to the annealing process. More specifically, the invention introduces a passivating agent plasma (e.g., nitrogen, oxygen, fluorine, chlorine) during a portion of the otherwise pure liner deposition, which allows a sub-stoichiometric barrier to be incorporated into the central portion of the liner. A subsequent thermal diffusion of a reactive gas (e.g., nitrogen, hydrogen, ammonia) into the liner will produce a stoichiometric combination of the liner and the reactive gas (e.g., $A_x;B_y$) mostly in the upper portion of the liner. As would be known by one ordinarily skilled in the art given this disclosure, the reactive gas and passivating agent can be the same or different, depending upon the specific application involved. In a preferred embodiment using a titanium liner, the reactive gas and the passivating agent are both nitrogen.

The sub-stoichiometric barrier of the passivating agent helps keep the liner from bonding with impurities during the annealing process by bonding the central portion of liner with the passivating agent instead of with the impurities. By including the passivating agent in the central portion of the liner, there is less free liner material available to bond with the impurities during the annealing process. Thus, any such impurities which bond with the liner will be principally limited to the upper portion of the liner. For example, titanium is highly reactive and will absorb oxygen (e.g., an impurity) very quickly when annealed. The fixed passivating agent barrier limits the oxidation of the upper portion of the liner.

The fixed passivating agent barrier similarly limits the amount of liner material that is available to bond with impurities (e.g., silicon) diffusing from lower layers. Thus, the barrier layer prevents, for example, silicon agglomeration during the annealing process. By reducing the amount of silicon in the liner, the formation of fluorine compounds is reduced during the subsequent fluorine based chemical vapor deposition.

Referring now to FIG. 1, a first embodiment of the invention is illustrated. FIG. 1 shows a conductive connection between various wiring levels within a structure. This connection could be formed to connect different wiring levels within an integrated circuit chip such as a semiconductor structure or could be used to form a contact between a wiring level and a device such as a storage device, a transistor, etc.

Item 10 in FIG. 1 represents a conductive structure such as a wiring level, storage capacitor, source/drain of a transistor, etc. formed on a substrate 16, such as a silicon substrate. The conductive layer 10 may be silicided, as discussed below, to reduce the resistivity. A dielectric 12 insulates the conductor 10 from other wiring levels or other devices within the integrated circuit. An opening 15 in the dielectric 12 is formed to make electrical contact between a second conductor 14 and the underlying conductor 10. As mentioned above, to increase adhesion between the conductor 14 and the insulator 12, a liner 13 is formed between the insulator 12 and the conductor 14.

The conductors 10, 14, opening 15 and insulator 12 are formed using well known conventional processes, such as those discussed in Cronin. For example, the conductor could comprise any conductive metal, alloy or polysilicon formed by any conventional process, such as sputtering, plasma enhanced chemical vapor deposition (PECVD), etc. Similarly, the conductor 10 could be silicided, for example, by annealing the structure to allow some silicon to diffuse from the substrate 16 into the conductor 10. The insulator 12 can comprise any common dielectric such as an oxide or glass insulator (e.g., boron phosphorous silicate glass (BPSG)), etc. The opening can be formed using conventional processes such as masking and etching or laser oblation.

As discussed above, with the invention the liner 13 is formed by doping a pure refractory metal liner material with a passivating agent. More specifically, a refractory material 13 such as tungsten, titanium, molybdenum, nickel, etc. is deposited using a conventional deposition process such as chemical vapor deposition (CVD), sputtering or evaporation. For example, the refractory metal can be sputtered from a refractory metal source in an argon atmosphere for an experimentally selected time period (e.g., 30–60 seconds) to any desired thickness (e.g., 300 Å to 600 Å).

During the formation of the liner (e.g., the middle 15–30 seconds of the refractory metal 13 deposition process), a passivating agent gas, such as nitrogen, chlorine, etc. is supplied to form the barrier layer 20. One ordinarily skilled in the art, in light of this disclosure, could establish any combination of flow rate, pressure, etc. to supply the passivating agent, so long as the amount of passivating agent that is supplied is less than an amount necessary to form a stoichiometric combination of the liner and the passivating agent, but is at least enough to impede a reaction between the refractory metal 13 and the substrate 16 and/or the conductor 10 during the subsequent annealing. In a preferred embodiment, nitrogen is supplied for 15–30 seconds at a flow rate of 18 sccm at a partial pressure of 6.5 Torr. The barrier can be formed in a very small portion of the liner 13 (e.g., 5%) or in the entire liner and preferably is formed in the middle 50%–66% of the liner 13.

Figure 2:
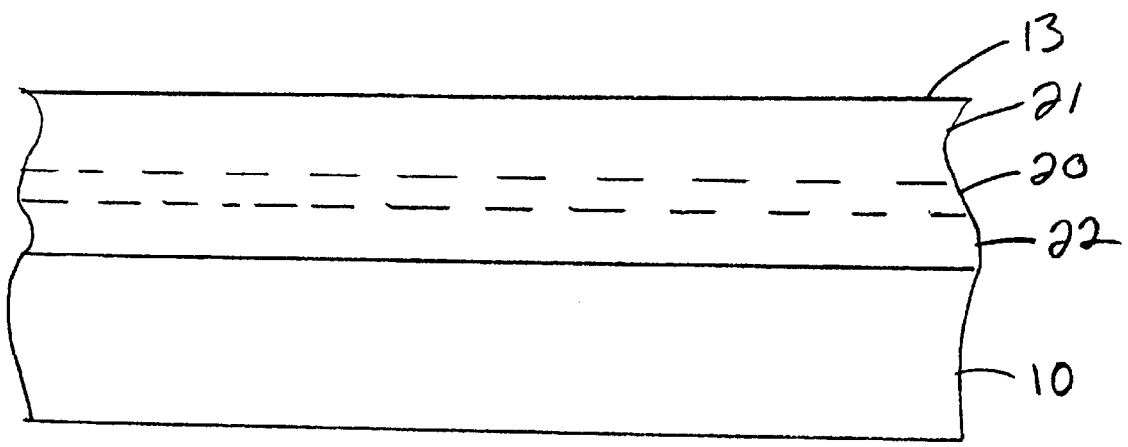
FIG. 2 is a schematic diagram of an integrated circuit structure according to the invention.

FIG. 2 illustrates an enlarged portion of the silicide layer 10 interface with the liner 13, shown in FIG. 1. The inventive process forms the region of passivating agent atoms 20 within the liner 13, as shown in FIG. 2. As described above, the concentration of passivating agent 20 within the liner 13 is to low to form a stoichiometric layer. Instead, item 20 in FIG. 2 merely represents an area within the liner 13 where a concentration of passivating agent atoms exists.

The structure is then annealed at an appropriate temperature for an appropriate time given the specific design requirements. In a preferred embodiment, the structure is annealed at a temperature between 550° C. and 650° C. for 3600 seconds in a nitrogen atmosphere in a batch furnace. The titanium liner 13 will react with nitrogen during the anneal at temperatures greater than 450° C. The higher the temperature, the greater the titanium/nitrogen reaction.

As discussed above, free impurities (e.g., oxygen) within the furnace will combine with the liner 13 during the annealing process. However, because the passivating agent atoms in the barrier 20 bond with the liner 13, the amount of liner 13 available to bond with the impurity is substantially reduced and any impurity compounds that form are only located in the upper section 21 of the liner 13. Therefore, the barrier layer substantially reduces the amount of impurity formation which occurs to the liner 13 and limits impurity formation to the upper portion 21 of the layer 13.

Further, as discussed above, a second reaction occurs between the liner 13 and the underlying layers. A frequent problem in the silicide 10 is the formation of partial silicides, that is, excessive silicon at the interface of the silicide 10 and the liner 13. During the anneal, the silicide 10 will consume the liner 13 faster than the liner 13 will react with ambient reactive element. However, once again, because the passivating agent atoms within the barrier layer 20 react with the liner, there is a substantially reduced amount of liner 13 available to react with the underlying material layers. Therefore, the barrier layer also limits the formation of silicides and other impurities to the lower portion 22 of the titanium layer 13.

While the anneal process may convert most of the barrier layer 20 into stoichiometric material (e.g., stoichiometric titanium nitride), a portion of the subs-toichiometric barrier layer 20 would remain after the anneal process and in the final integrated circuit device.

Conventional processes are then used to deposit the conductive layer 14. For example a conductive tungsten layer 14 can be deposited by flowing $SiH_4$ (100–200 sccm) and $WF_6$ (200–400 sccm) in the presence of hydrogen and a carrier gas at 450° C. for a time sufficient to form a layer at least 0.7 $\mu$m thick. However, the barrier layer 20 formed by the foregoing process, limits silicon agglomeration which reduces the amount of silicon available in the liner 13 to form fluoride compounds.

Figure 3:
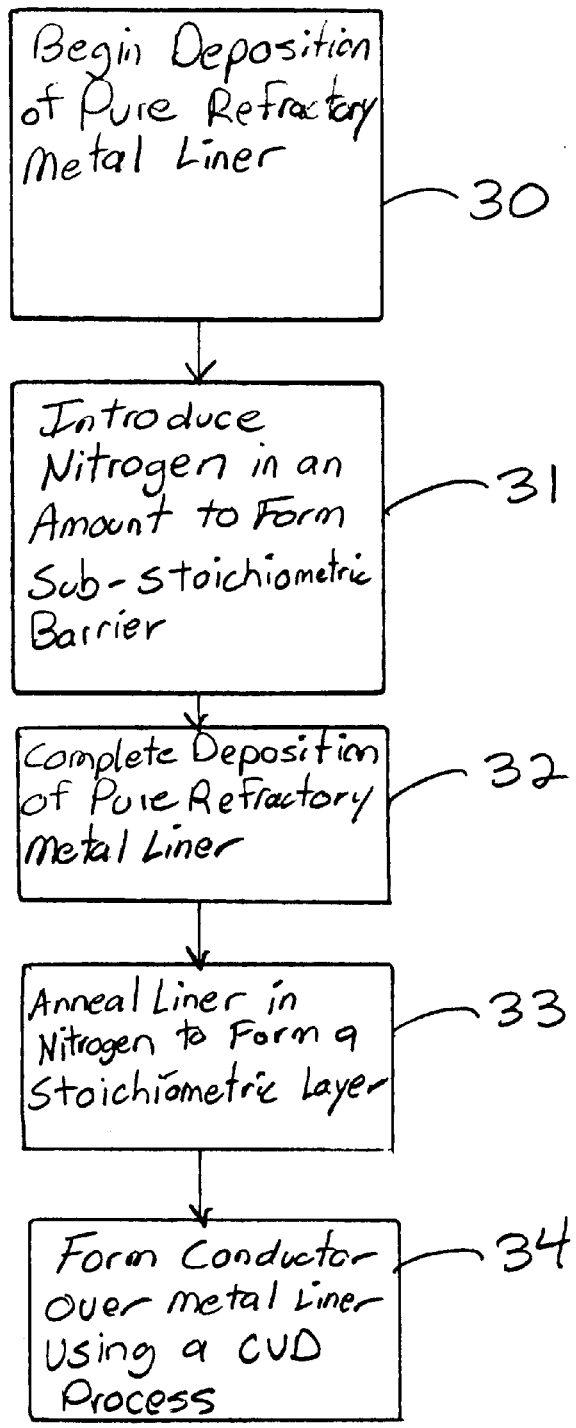
FIG. 3 is a flow diagram illustrating a preferred method of the invention.

FIG. 3 is a flowchart of an embodiment of the invention. More specifically, in item 30, the deposition of the pure liner 13 is begun. As shown in item 31, the passivating agent is introduced in an amount to form a sub-stoichiometric barrier 20. Then, as shown in item 32, the remainder of the liner 13 is completed. The liner is then annealed in a reactive element atmosphere to form a stoichiometric layer 21 above the barrier layer 20. Finally, after the completion of the metal liner 13, the conductor 14 is formed using a chemical vapor deposition process, as described above.

The invention is superior to other possible alternatives for forming a liner (e.g., titanium nitride) over a substrate. For example, if pure titanium is annealed in a nitrogen environment (as disclosed in Cronin), excessive amounts of silicon may migrate from the underlying substrate and a large portion of the titanium may be oxidized. The migration of excessive amounts of silicon promotes fluorine compounds which compromises the liner's integrity. The oxidation of the titanium leads increases resistance. As discussed above, the fixed barrier 20 acts as a passivating layer to reduce silicon agglomeration and oxidation of the titanium.

Alternatively, a titanium nitride alloy can be deposited (e.g., by sputtering or plasma vapor deposition (PVD)). However, sputtering or PVD of a titanium nitride alloy contaminates the deposition chamber with large amounts of nitride and titanium, which requires that a separate deposition chamber be used, thus driving up the costs and increasing production time. Further, sputtered or PVD titanium nitride generally contains many defects which would reduce the effectiveness of the titanium liner. The invention avoids these disadvantages by forming the sub-stoichiometric barrier 20 in the same deposition chamber where (and at the same time when) the liner 13 is being formed.

Additionally, the invention limits the amount of passivating agent introduced during the liner formation to sub-stoichiometric levels. If an excessive amount of passivating agent (a sufficient amount to form stoichiometric titanium nitrite) is introduced during the liner deposition, the liner deposition rate would be severely reduced. Further, excessive amounts of nitrogen cause titanium to grow in columns. The space between such columns provides a path for the fluorine used in the subsequent tungsten CVD process to react with the underlying silicon, again allowing the formation of undesirable fluorine compounds.

While the invention has been described in terms of preferred embodiments, those skilled in the art will recognize that the invention can be practiced with modification within the spirit and scope of the appended claims. For example, while the invention has been described with reference to a tungsten contact and a titanium liner, as would be readily known by one ordinarily skilled in the art given this disclosure, the invention is equally applicable to any similar combination of conductor/liner such as copper stud with a tantulum nitride liner.

What is claimed is:

1. A process of forming a refractory metal liner, comprising:
   depositing a layer of refractory metal on a first conductive layer,
   wherein a first portion of said depositing comprises depositing said refractory metal,
   wherein a second portion of said depositing is carried out in the presence of an amount of passivating agent that is less than an amount of passivating agent necessary to form a stoichiometric combination of said refractory metal and said passivating agent,
   wherein a third portion of said depositing comprises depositing said refractory metal,
   wherein both of said first and third portions of said depositing are free of said passivating agent, and
   wherein said method further comprises annealing said refractory metal and said first conductive layer in a first element ambient, thereby forming a stoichiometric refractory metal with said first element in at least a portion of a top half of said layer of refractory metal without forming a stoichiometric refractory metal with said elements throughout portions of said refractory metal formed during said second portion of said depositing step.

2. The process in claim 1, wherein said depositing step forms a barrier in a central portion of said layer of refractory metal.

3. The process in claim 2, wherein said barrier impedes impurities from diffusing through said layer of refractory metal during said annealing process.

4. The process in claim 3, wherein said impurities comprise silicon impurities.

5. The process in claim 2, further comprising forming a second conductive layer over said layer of refractory metal in a chemical vapor deposition process, wherein said barrier impedes impurities from diffusing through said layer of refractory metal during said chemical vapor deposition process.

6. The process in claim 5, wherein said impurities comprise fluorine impurities.

7. The process in claim 1, wherein:
   said refractory metal comprises one of tungsten, titanium, molybdenum and nickel;
   said passivating agent comprises one or more of nitrogen and chlorine; and
   said first element comprises one or more of hydrogen, nitrogen, and ammonia.

8. A process of forming an electrical connection in an integrated circuit chip, said process comprising:
   depositing a liner on a first conductive layer,
   wherein a first portion of said depositing comprises depositing said refractory metal,
   wherein a second portion of said depositing is carried out in the presence of a passivating material having a concentration less than an amount necessary to form a stoichiometric combination of said liner and said passivating material,
   wherein a third portion of said depositing comprises depositing said refractory metal,
   wherein both of said first and third portions of said depositing are free of said passivating agent,
   wherein said passivating material combines with said liner to form a barrier as deposited in said second portion of said depositing, said barrier impeding impurities from diffusing from said first conductive layer through said liner, and
   wherein said method further comprises annealing said liner and said first conductive layer in a first element ambient; and
   forming a second conductive layer over said liner, wherein said barrier impedes said impurities from diffusing from said second conductive layer through said liner during said forming of said second conductive layer.

9. The process in claim 8, wherein said forming of said second conductive layer over said liner comprises a chemical vapor deposition process.

10. The process in claim 8, wherein said impurities comprise one or more of silicon impurities and fluorine impurities.

11. The process in claim 8, wherein:
   said liner comprises one of tungsten, titanium, molybdenum and nickel;
   said passivating agent comprises one or more of nitrogen and chlorine;
   said first element comprises one or more of hydrogen, nitrogen, and ammonia; and
   said second conductive layer comprises one of tungsten and copper.

12. A process of forming an integrated circuit chip comprising:
   depositing a liner on a first conductive layer,
   wherein a first portion of said depositing comprises depositing said refractory metal,
   wherein a second portion of said depositing is carried out in the presence of a passivating material having a concentration less than an amount necessary to form a stoichiometric combination of said liner and said passivating material,
   wherein a third portion of said depositing comprises depositing said refractory metal,
   wherein both of said first and third portions of said depositing are free of said passivating material,
   wherein said passivating material combines with said liner as deposited in said second portion of said depositing to form a barrier, said barrier impeding impurities from diffusing from said first conductive layer through said liner, and
   wherein said method further comprises annealing said liner and said first conductive layer in a first element ambient; and forming a second conductive layer over said liner, wherein said barrier impedes said impurities from diffusing from said second conductive layer through said liner during said forming of said second conductive layer.

13. The process in claim 12, wherein said forming of said second conductive layer over said liner comprises a chemical vapor deposition process.

14. The process in claim 12, wherein said impurities comprise one or more of silicon impurities and fluorine impurities.

15. The process in claim 12, wherein:

said liner comprises one of tungsten, titanum, molybdenum and nickel;

said passivating agent comprises one or more of nitrogen and chlorine;

said first element comprises one or more of hydrogen, nitrogen, and ammonia; and said second conductive layer comprises one of tungsten and copper.

* * * * *